United States Patent
Romig et al.

(10) Patent No.: US 8,816,513 B2
(45) Date of Patent: Aug. 26, 2014

(54) ELECTRONIC ASSEMBLY WITH THREE DIMENSIONAL INKJET PRINTED TRACES

(75) Inventors: Matthew David Romig, Richardson, TX (US); Lance Cole Wright, Allen, TX (US); Leslie Edward Stark, Rowlett, TX (US); Frank Stepniak, Allen, TX (US); Sreenivasan K. Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/591,719

(22) Filed: Aug. 22, 2012

(65) Prior Publication Data

US 2014/0054795 A1 Feb. 27, 2014

(51) Int. Cl.
- *H01L 23/48* (2006.01)
- *H01L 23/52* (2006.01)
- *H01L 29/40* (2006.01)

(52) U.S. Cl.
USPC .............. 257/784; 257/E23.01; 257/E21.499; 438/109

(58) Field of Classification Search
None
See application file for complete search history.

(56) References Cited

U.S. PATENT DOCUMENTS

| | | | |
|---|---|---|---|
| 6,818,976 B2 * | 11/2004 | Kang et al. | 257/684 |
| 2009/0236735 A1 * | 9/2009 | Corisis et al. | 257/723 |
| 2009/0321929 A1 * | 12/2009 | Feng et al. | 257/738 |
| 2010/0059251 A1 | 3/2010 | Remizov et al. | |
| 2010/0149249 A1 | 6/2010 | Baik et al. | |
| 2010/0178420 A1 | 7/2010 | Lee et al. | |
| 2011/0042125 A1 | 2/2011 | Lee et al. | |
| 2011/0304016 A1 * | 12/2011 | Nakamura et al. | 257/532 |
| 2013/0001709 A1 * | 1/2013 | Liu | 257/415 |
| 2013/0015578 A1 * | 1/2013 | Thacker et al. | 257/738 |

OTHER PUBLICATIONS

Inkjet printed dielectrics for electronic packaging of chip embedding modules, Mengel et. al., Microelectronic Engineering 87 (2010), 593-596.*

Romig, Matthew David; Wright, Lance Cole; Stark, Leslie Edward; Stepniak, Frank; Koduri, Sreenivasan K., "Integrated Circuit Package With Printed Circuit Layer", U.S. Appl. No. 13/723,874, filed Dec. 21, 2012, 24 pages.

Romig, Matthew David; Wright, Lance Cole; Stark, Leslie Edward; Stepniak, Frank; Koduri, Sreenivasan K., "Discrete Device Mounted on Substrate", U.S. Appl. No. 13/668,901, filed Nov. 5, 2012, 17 pages.

(Continued)

*Primary Examiner* — Sonya D McCall Shepard
(74) *Attorney, Agent, or Firm* — Steven A. Shaw; Frederick J. Telecky, Jr.

(57) ABSTRACT

One method of making an electronic assembly includes mounting one electrical substrate on another electrical substrate with a face surface on the one substrate oriented transversely of a face surface of the other substrate. The method also includes inkjet printing on the face surfaces a conductive trace that connects an electrical contact on the one substrate with an electrical connector on the other substrate. An electronic assembly may include a first substrate having a generally flat surface with a first plurality of electrical contacts thereon; a second substrate having a generally flat surface with a second plurality of electrical contacts thereon, the surface of the second substrate extending transversely of the surface of said first substrate; and at least one continuous conductive ink trace electrically connecting at least one of the first plurality of electrical contacts with at least one of the second plurality of electrical contacts.

15 Claims, 3 Drawing Sheets

(56) References Cited

OTHER PUBLICATIONS

Mengel, Manfred; Nikitin, Ivan, "Inkjet Printed Dielectrics for Electronic Packaging of Chip Embedding Modules", Microelectronic Engineering 87 (2010), pp. 593-596, journal homepage: www.elsevier.com/locate/mee.

Kaija, Kimmo; Pekkanen, Ville; Mantysalo, Matti; Koskinen, Santtu; Niittynen, Juha; Halonen, Eerik; Mansikkamaki, Pauliina, "Inkjetting Dielectric Layer for Electronic Applications", Microelectronic Engineering 87 (2010), pp. 1984-1991, journal homepage: www.elsevier.com/locate/mee.

* cited by examiner

201 — MOUNTING ONE ELECTRICAL SUBSTRATE ON ANOTHER ELECTRICAL SUBSTRATE WITH A FACE SURFACE ON THE ONE SUBSTRATE ORIENTED TRANSVERSELY OF A FACE SURFACE OF THE OTHER SUBSTRATE

202 — INKJET PRINTING ON THE FACE SURFACES A CONDUCTIVE TRACE THAT CONNECTS AN ELECTRICAL CONNECTOR ON THE ONE SUBSTRATE WITH AN ELECTRICAL CONNECTOR ON THE OTHER SUBSTRATE

ELECTRONIC ASSEMBLY WITH THREE DIMENSIONAL INKJET PRINTED TRACES

BACKGROUND

Integrated circuits ("IC's") are ubiquitous in modern electrical products. Currently most integrated circuits are formed in individual semiconductor units called dies or dice. Each semiconductor die typically includes a silicon substrate block having multiple internal and/or external circuit layers. The circuit layers are usually formed by photolithographic or screen printing processes. The various circuits in these circuit layers may be electrically connected to a metal lead frame. The die and lead frame are often encased in a protective material such as epoxy. One or more electrical contacts provided by the lead frame are formed on or project from the surface of the die. The electrical contacts allow the circuitry in the die to be electrically connected to other electronics.

Modern electronic assemblies usually include a number of integrated circuits dies and other electronic devices that are electrically connected by a printed circuit board (PCB) or other interconnect apparatus such as ceramic multilayer interconnect boards ("MIB's"). IC dies are typically box shaped and have two oppositely positioned largest faces. The dies are usually mounted on a PCB with one of the largest faces of the die abutting a face surface of the PCB.

A process known as wire bonding is most often used to connect IC dies to a printed circuit board. With wire bond connection, connection points or bumps located on the top face of a die are soldered to thin bond wires. The other ends of the bond wires are soldered to contact pads on the PCB.

In another widely used process, solder balls are formed on contact areas on one of the large face surfaces of a die. These solder balls are then placed in contact with corresponding contact pads on a PCB. The die and PCB are then heated. Heating causes the solder balls to bond with the contact pads on the PCB thus physically and electrically connecting the die to the PCB.

DETAILED DESCRIPTION

Figure 1:
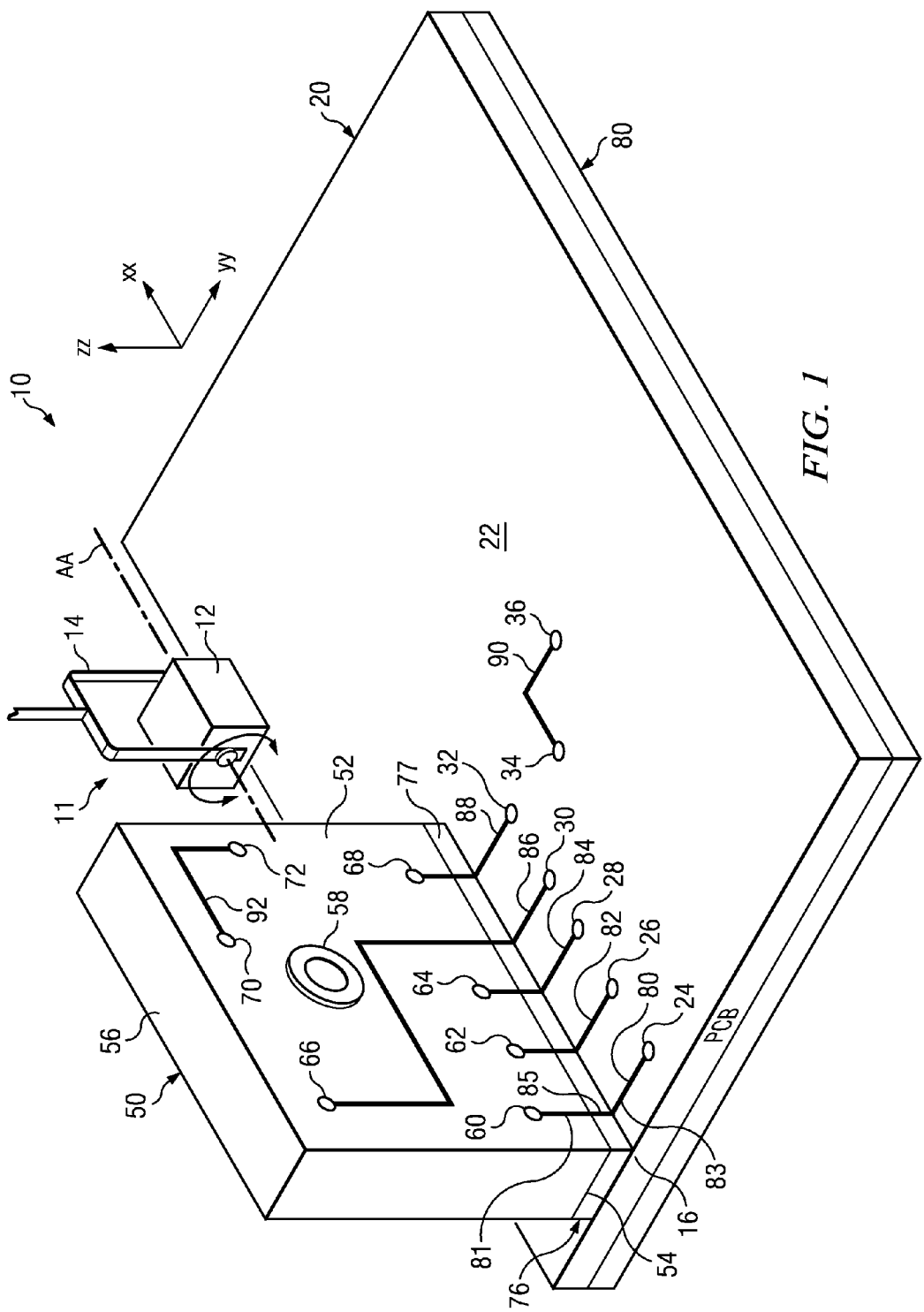
FIG. 1 is an isometric view of an electronic assembly having an electronic device mounted on an electrical substrate.
Figure 2:
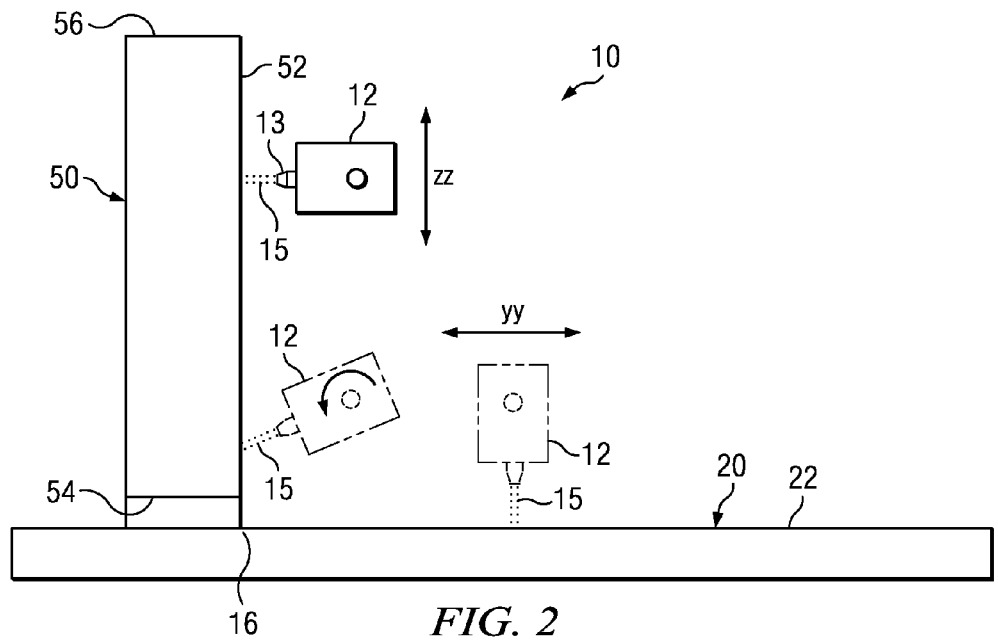
FIG. 2 is a side elevation view of the electronic assembly of FIG. 1.
Figure 3:
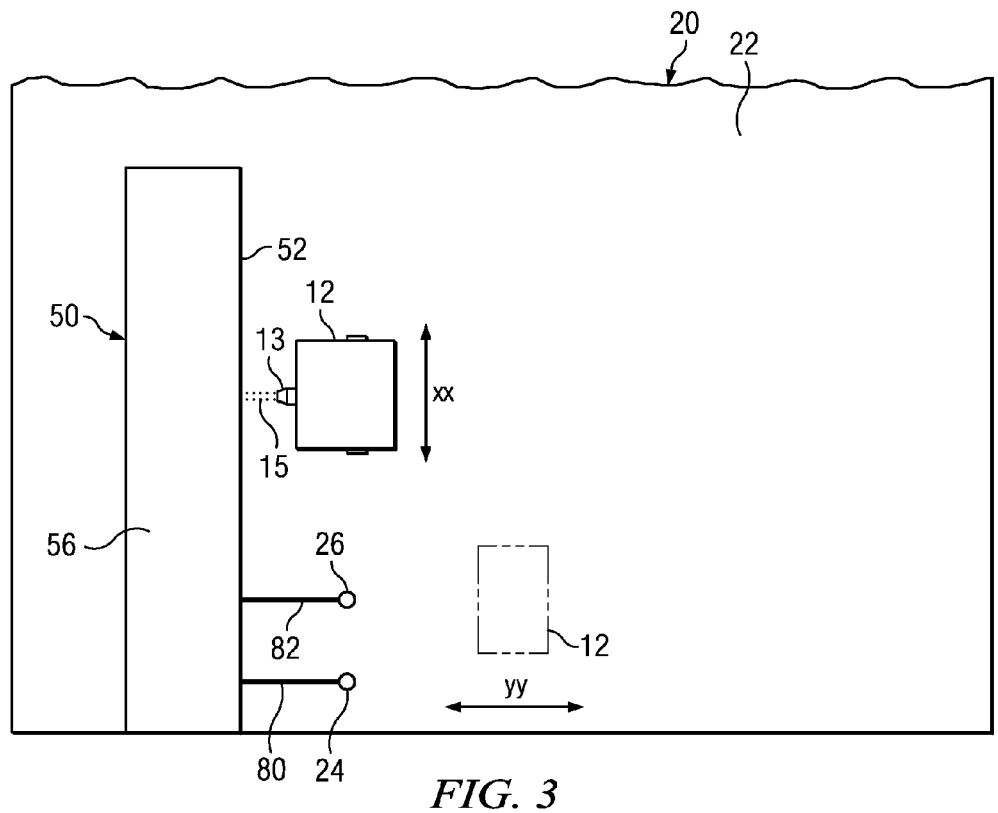
FIG. 3 is a top plan view of the electronic assembly of FIG. 1.

FIGS. 1-3, in general, disclose an electronic assembly 10 that includes a substrate 20 with at least one die 50 connected to the substrate 20 by an attachment layer 76. The substrate 20 has a first face surface 22 with electrical contacts 24, 26, 28, etc., positioned on it. The die 50 has a first face surface 52 and a second face surface 54 extending generally perpendicular to the first face surface 52. Electrical contacts 60, 62, 64, 66, etc. are positioned on the die first face surface 52. The attachment layer 76 is positioned between and physically connects the substrate first face surface 22 and the die second face surface 54. The attachment layer has a first face surface 77 positioned substantially perpendicular to the substrate first face surface 22 and substantially parallel to the die first face surface 52. A conductive trace, e.g. 80 extends between electrical contacts, e.g. 24, 60 on the first faces 22, 52 of the substrate 20 and die 50. The trace 80 is formed from electrically conductive ink dispensed from an inkjet printhead 12.

A method of making an electronic assembly 10 is also disclosed. This method, in general, includes mounting one electrical substrate 50 on another electrical substrate 20 with a face surface 52 on the one substrate 50 oriented transversely of a face surface 22 of the other substrate. The method also includes inkjet printing on the face surfaces 52, 22 a conductive trace 80 that connects an electrical contact 60 on the one substrate 50 with an electrical contact 24 on the other substrate 20.

Having thus generally described an electronic assembly and a method of making it, certain embodiments of an electronic assembly and method of making it will now be described in detail FIGS. 1-3 illustrate an electrical assembly 10 which includes a substrate 20 having a generally flat first face surface 22. A plurality of electrical contacts (sometimes referred to herein as connectors) 24, 26, 28, 30, 32, 34, 36 (only 24 and 26 are shown in FIG. 3) are provided on the first face surface 22. A second substrate is mounted on the first substrate. In the embodiment shown in FIGS. 1-3, the second substrate may be an electronic device such as a first die. The first die 50 has a generally flat first face 52, which may be one of the two largest faces of the die 50. The first die 50 has a second face surface 54 extending generally perpendicular to the first face surface 52. The second face surface 54 is sometimes referred to herein as the "bottom face surface." First die 50 has a generally flat third face surface 56 positioned generally perpendicular to the first face surface 52 and parallel to the second face surface 54. Third face surface 56 is sometimes referred to herein as the "top face surface." The die first face surface 52 may have a sensor 58 operably mounted thereon. The sensor 58 may be, for example, a conventional sound, thermal, motion or light sensor. Also provided on the first face surface 52 are a plurality of electrical contacts 60, 62, 64, 66, 68, 70, 72. The bottom face surface 54 of the first die 50 is attached to the first face surface 22 of the substrate 20 by a layer of attachment materials 76 which may comprise conventional die attachment material such as epoxy or solder or other attachment material now known or later developed.

The electrical contacts on the substrate 20 are connected to the electrical contacts on the first die 50 by a plurality of electrical traces 82, 84, 86, 88. Some of the electrical traces, e.g. 34, 36, on the substrate 22 may be connected directly to one another as by a conductive trace 90. Similarly, conductors 70, 72 on die 50 may be connected to one another by a trace 92.

The above-described conductive traces may all be inkjet printed traces. The printing of conductive traces on a two dimensional surface using an inkjet printer is known in the art as described in U.S. patent application publication no. U.S. 2010/0059251 published Mar. 11, 2010 for "Printed Circuit Board and Manufacturing Method" of Sergey Remizov, et al.; U.S. 2010/0149249 published Jun. 17, 2010 for "Surface Treatment Method, Circuit Lines Formation Method, Circuit Lines Formation Apparatus and Printed Circuit Board Formed Thereby" of Yoon-Ah Baik, et al.; U.S. 2011/0042125 published Feb. 24, 2011 for "Conductive Ink, Method of Preparing Medal Wiring Using Conductive Ink, and Printed Circuit Board Prepared Using Method" of Jong-Hee Lee, each of which is hereby incorporated by reference for all that is disclosed therein. However, to applicants' knowledge, three dimensional inkjet printing of conductive traces on an electrical assembly 10 was first developed by applicant.

Various ink formulations that may be used to inkjet print conductive traces are known in the art, such as those disclosed in the above patent publications incorporated by reference. Another such ink formulation suitable for printing conductive traces is disclosed in U.S. Patent Application U.S. 2010/0178420 published Jul. 15, 2010, which is hereby incorporated by reference for all that is disclosed therein. Other suitable inkjet ink formulations are commercially available from various manufacturers such as DuPont, Microcircuit Materials, 14 T.W. Alexander Dr., Research Triangle Park, N.C. 27709. One such DuPont inkjet ink is sold under the product designation 5000 Silver Conductor.

As illustrated by FIG. 1, inkjet traces 80, 82, 84, 86, 88 connect, respectively, contacts 24 and 60, 26 and 62, 28 and 64, 30 and 66, and 32 and 68. Each of these traces 80, 82, 84, 86, 88 includes a first portion, e.g. 81, contacting the first face surface 52 of the die 50 and a second portion, e.g. 83, contacting the first face surface 22 of the substrate 20. A third portion, e.g., 85, of each trace connects the first and second portions 81, 83 and contacts the surface 77 of the attachment material 76. (However, in some embodiments the substrate 20 is mechanically connected to the die 50 without use of attachment material 76, as by joints or friction fit or nail or screw like structures. In such cases there may be no third trace portion 85.) In many cases, the surface 77 of the attachment material 76 is substantially coplanar with the first die first face surface 52. Some of the conductive traces, e.g. 92, extend between two contact points 70, 72 on the die 50. Other traces, e.g. 90, extend between two contact points 34, 36 on the first substrate surface 22. In some embodiments, each of the conductive traces is continuously printed by an inkjet sprayhead. In other words, there are no time gaps between printing of the various portions of the trace. Each trace, e.g. 80, as thus continuously printed, is physically continuous from the contact, e.g. 24, on the first face surface 22 of the substrate 20 to the contact, e.g. 60, on the first face surface 52 of die 50.

One printhead assembly is shown at 11 in FIG. 1. The printhead assembly may include a printhead 12 having at least one nozzle 13, FIGS. 2 and 3, operably connected to a reservoir. The reservoir may be provided within the printhead 12 itself or may be located remotely and connected as by fluid conduit to the printhead 12. Inkjet printheads are well known in the art and any such printhead capable of forming a trace of suitable dimensions may be used for this purpose. The printhead 12 may be mounted on a displaceable support assembly 14 which, in one embodiment, enables the printhead to be displaced laterally, parallel to the XX axis, longitudinally, parallel to the YY axis, or vertically, parallel to the ZZ axis. The printhead 12 may also be rotatable about one or more axes, such as, for example, axis AA that is parallel to the lateral axis XX. The printhead 12 may thus be moved vertically, laterally and longitudinally to produce rectilinear conductive traces extending between substrate face surface 22 and die face surface 52. In other embodiments the printhead may be displaced about multiple axes at the same time to produce curved traces. In making the transition from vertical printing of the die face surface 52 to the substrate face surface 22, the printhead 12 may first be positioned such that the spray jet 15 is directed perpendicular to surfaces 52 and 77, then rotated about axis AA as best shown in FIG. 2, to produce a portion of the trace near the intersection line 16 of the attachment material face surface 77 (or the die first face surface 52 in embodiments where there is no attachment material) and the substrate first face surface 22. Next, the printhead 12 may be rotated to a position such that the spray 15 is only perpendicular to the first face surface 22 of the substrate 20 while it is being displaced in either the lateral (XX) or longitudinal (YY) direction. In this embodiment the printhead 12 rotates about 90° during the transitional printing period. In another embodiment (not shown), the printhead 12 is mounted at a fixed angle with respect to the surfaces 22 and 52 such that the inkjet spray 15 contacts each of these surfaces at an angle of about 45°. In this embodiment, rotation of head 12 about axis AA is not required.

Robotics and machine vision systems for producing the above described or other displacements of a printhead 12, e.g., pick and place machine robotics, are well known in the industry and will thus not be further described herein.

Figures 4, 5:
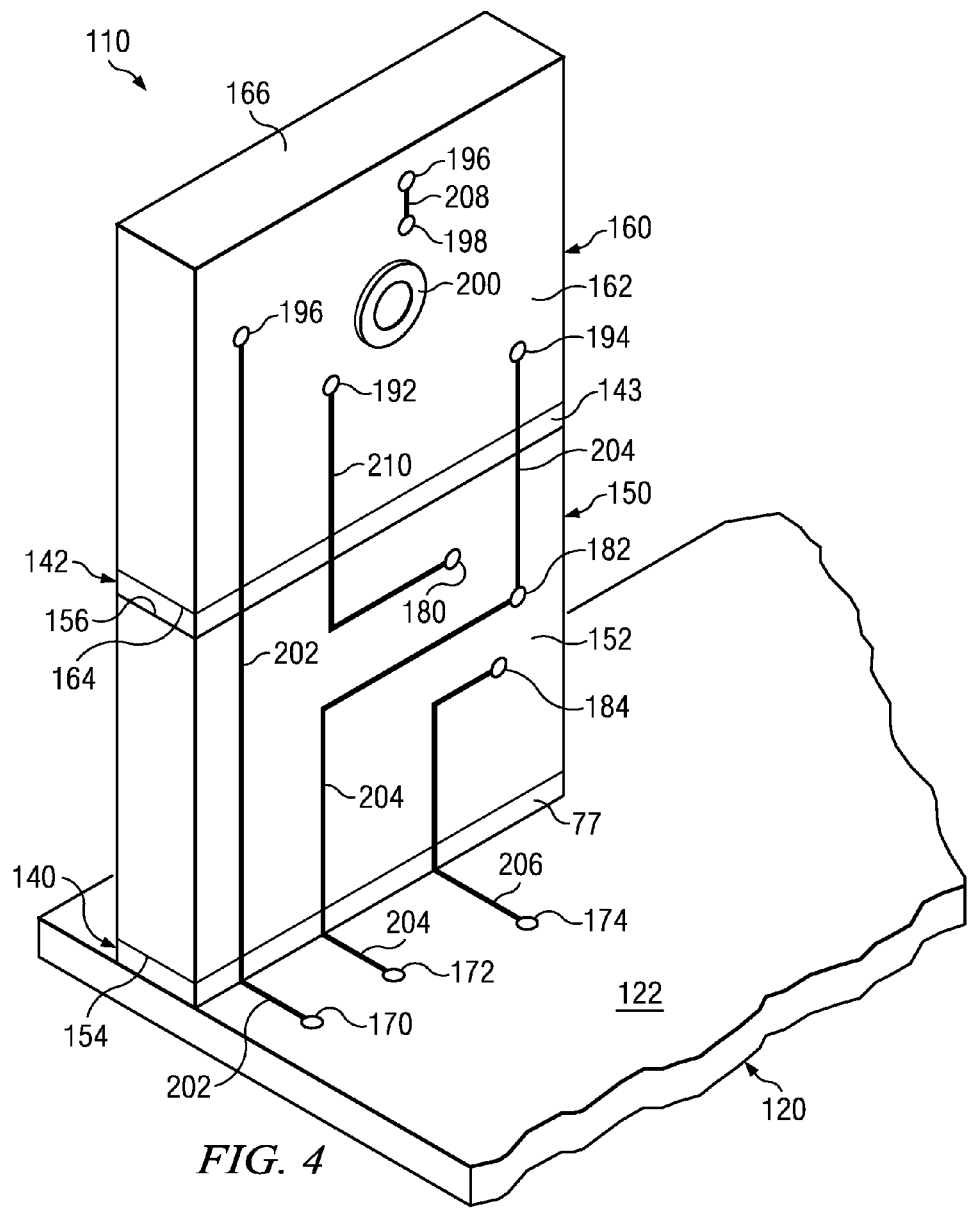
FIG. 4 is an isometric view of first and second stacked electronic devices connected to an electrical substrate.
FIG. 5 is a flow diagram illustrating a method of making an electronic assembly.

FIG. 4 illustrates an electronic assembly 110 similar to electronic assembly 10 described above except that a second electronic device such as a second die 160 is mounted on top the first electronic device (first die 150). In this assembly, the second die 160 has a vertically and laterally extending first face surface 162, a laterally and longitudinally extending second face surface 164 and a laterally and longitudinally extending top face surface 166. In this embodiment, the third (top) face surface 156 of the first die 150 is attached to the second (bottom) face surface 164 of the second die 160 by a second adhesive layer 142 having a face surface 143.

The first face surface 122 of substrate 120 may have contacts 170, 172, 174 provided thereon. The first face surface 152 of first die 150 may have contacts 180, 182, 184 provided thereon. The first face surface 162 of second die 160 may have contacts 190, 192, 194, 196, 198 provided thereon. A sensor 200 or other electrical component may be provided on the upper die 160. A trace 202 may extend from the second die contact 190 to the substrate contact 170. In this case the trace is adhered to surfaces 162, 143, 152, 77 and 22. Another trace 204 may connect contacts 172, 182 and 194 located on the first surfaces of substrate 120, first die 150, and second die 160, respectively. Conductive trace 206 connects contact 174 on substrate surface 122 with contact 184 on first die first surface 152. A trace 208 connects two electrical contacts 196, 198 located on the second die first surface 162. A trace 210 connects contact 180 on first die surface 152 to contact 192 on second die first face surface 162. The same printhead assembly described above with reference to FIGS. 1-3, or another printhead assembly capable of displacement in three dimensions may be used to provide the inkjet printed traces illustrated in FIG. 4.

It is to be understood that terms such as vertical, lateral, up, down, bottom, top and the like that are sometimes used in an absolute sense to indicate an orientation in a gravitational field are not used in that sense herein. Rather such terms are used in a relative sense, usually with reference to the drawings, to indicate the relationship between various components or parts thereof.

The drawings show electronic assemblies 10 and 110 that include a single die mounted on a PCB and a pair of vertically stacked dies mounted on a PCB. Other embodiments in which multiple dies or other devices are mounted on a PCB or other interconnect boards in various orientations and stacking arrangements have not been specifically described to avoid unnecessary repetition. However it will be understood that the novel concepts disclosed herein also apply to such alternative configurations.

As used herein the term "electrical substrate" refers to an object having at least one generally flat face that has an electrical contact thereon. Thus an "electrical substrate" may be an electrical connecter board such as a wiring board, printed circuit board, ceramic or other MIB, or other interconnect structure. The term "electrical substrate also encompasses semiconductor dies and various other electronic devices such as wafers, semiconductor packages, ceramic or other multilayer interconnect boards ("MIB's), flex tape, passive resistors, passive capacitors, passive inductors, electrical housings and connectors. In the specifically described embodiments of FIGS. 2-4 the second substrate is referred to as a die 50, but it is to be understood that many different types of electrical substrates, such as those listed above, could be substituted for die 50. Similarly, various other electronic substrates could be substituted for dies 150, 160.

The first and second substrates 20, 50 shown in FIGS. 1-3 are described as having generally perpendicular face surfaces 22, 52. In some embodiments surfaces 22 and 52 may not be truly perpendicular. For example one may be oriented at an angle of 75°, etc., relative to the other. The term "transversely" as used herein refers to surfaces positioned perpendicular to one another and to other orientations of planar, nonparallel surfaces.

Most inkjet printable inks require heat for proper curing after being printed. Accordingly once an electronic assembly 10, 110 has been printed it may be transferred to a curing environment such as a box oven, IR belt furnace, or the like (not shown) for curing at an appropriate temperature for an appropriate curing period that will depend upon the ink that is used.

One method of making an electronic assembly is illustrated in the flow chart of FIG. 5. The method may include mounting one electrical substrate on another electrical substrate with a face surface on the one substrate oriented transversely of a face surface of the other substrate, as shown at 201. The method may further include inkjet printing on the face surfaces a conductive trace that connects an electrical connector on the one substrate with an electrical connector on the other substrate, as shown at 202.

Although certain embodiments of an electronic assembly having inkjet printed traces and a method of making an electronic assembly have been described in detail herein, it is to be understood that the electronic assembly and method are not limited to these specific embodiments and may be otherwise constructed. Many alternative embodiments of the disclosed assembly and method will be apparent to those skilled in the art after reading this disclosure. It is intended that the appended claims be broadly construed so as to encompass such alternative embodiments, except to the extent limited by the prior art.

What is claimed is:

1. An electronic assembly comprising:
   a substrate having a substrate first face surface and at least one electrical contact positioned on said substrate first face surface;
   a first die having a first die first face surface, a first die second face surface extending generally perpendicular to said first die first face surface, said first die first face surface having a greater surface area than said first die second face surface and a plurality of first die electrical contacts positioned on said first die first face surface, wherein said plurality of first die electrical contacts positioned to receive conductive traces after being mounted;
   an attachment layer positioned between and physically connecting said substrate first face surface and said die second face surface and having an attachment layer first face surface positioned substantially perpendicular to said substrate first face surface and substantially parallel to said first die first face surface;
   said first die mounted on said substrate such that said first die first face surface is oriented transversely of said substrate first face surface, wherein said plurality of first die electrical contacts capable of receive conductive traces;
   at least one conductive trace applied to said first die first face surface extending between said at least one substrate electrical contact and at least one first die electrical contact, said trace comprising electrically conductive ink;
   a second die mounted on said first die; and
   a second die first face surface positioned in substantially coplanar relationship with said first die first face surface and wherein at least one first die electrical contact is positioned on said second die first face surface.

2. The electronic assembly of claim 1 wherein said at least one conductive trace comprises a first portion engaging said first die first face surface and said attachment layer first face surface and a second portion engaging said substrate first face surface.

3. The electronic assembly of claim 1 wherein said ink is uncured ink.

4. The electronic assembly of claim 1 wherein said ink is cured ink.

5. The electronic assembly of claim 1 wherein said at least one substrate electrical contact comprises a plurality of substrate electrical contacts and wherein said at least one conductive trace comprises a plurality of conductive traces extending between different ones of said first die electrical contacts and said substrate electrical contacts.

6. The electronic assembly of claim 1 comprising at least one trace extending between at least one of said plurality of first die electrical contacts.

7. The electronic assembly of claim 1 wherein said first die first face surface has a sensor positioned thereon.

8. The electronic assembly of claim 1 further comprising an inkjet printed die interconnect trace electrically connecting said at least one first die electrical contact positioned on said second die first face portion to one of said plurality of first die electrical contacts on said first die first face surface.

9. The electronic assembly of claim 1 wherein said at least one first die electrical contact on said second die is connected by an inkjet printed trace to at least one of said plurality of substrate electrical contacts.

10. The electronic assembly of claim 1 wherein said substrate is one of semiconductor dies, wafers, semiconductor packages and encapsulant therefor, ceramic or other multilayer interconnect boards ("MIB's), printed circuit boards, flex tape, passive resistors, passive capacitors and passive inductors, electrical housing and electrical connectors.

11. The electronic assembly of claim 2 wherein said first trace portion is positioned substantially perpendicular to said second trace portion.

12. The electronic assembly of claim 7 wherein said sensor comprises one of a sound sensor, a thermal sensor, a motion sensor, and a light sensor.

13. An electronic assembly comprising:
   a substrate having a substrate first face surface and at least one electrical contact positioned on said substrate first face surface;
   at least one die having a die first face surface, a die second face surface extending generally perpendicular to said die first face surface and at least one die electrical contact positioned on said die first face surface;
   an attachment layer positioned between and physically connecting said substrate first face surface and said die second face surface and having an attachment layer first face surface positioned substantially perpendicular to said substrate first face surface and substantially parallel to said die first face surface;

at least one conductive trace extending between said at least one substrate electrical contact and said at least one die electrical contact, said trace comprising electrically conductive ink;

a second die mounted on said first die, wherein said second die comprises a second die first face surface positioned in substantially coplanar relationship with said first die first face surface and wherein at least one electrical contact is positioned on said second die first face surface.

14. The electronic assembly of claim 13, further comprising an inkjet printed die interconnect trace electrically connecting said at least one electrical contact positioned on said second die first face portion to one of said plurality of electrical contacts on said first die first face surface.

15. The electronic assembly of claim 13 wherein said at least one electrical contact on said second die is connected by an inkjet printed trace to at least one of said plurality of substrate electrical contacts.

\* \* \* \* \*